(12) United States Patent
Nakayama et al.

(10) Patent No.: US 11,274,182 B2
(45) Date of Patent: *Mar. 15, 2022

(54) POLY(AMIC ACID), POLY(AMIC ACID) SOLUTION, POLYIMIDE, POLYIMIDE FILM, LAYERED PRODUCT, FLEXIBLE DEVICE, AND PRODUCTION METHOD FOR POLYIMIDE FILM

(71) Applicant: KANEKA CORPORATION, Osaka (JP)

(72) Inventors: Hirofumi Nakayama, Otsu (JP); Mari Uno, Otsu (JP)

(73) Assignee: KANEKA CORPORATION, Osaka (JP)

( * ) Notice: Subject to any disclaimer, the term of this patent is extended or adjusted under 35 U.S.C. 154(b) by 176 days.

This patent is subject to a terminal disclaimer.

(21) Appl. No.: 16/611,496

(22) PCT Filed: May 2, 2018

(86) PCT No.: PCT/JP2018/017545
§ 371 (c)(1),
(2) Date: Nov. 7, 2019

(87) PCT Pub. No.: WO2018/207706
PCT Pub. Date: Nov. 15, 2018

(65) Prior Publication Data
US 2020/0102423 A1 Apr. 2, 2020

(30) Foreign Application Priority Data
May 11, 2017 (JP) .............................. JP2017-094708

(51) Int. Cl.
*C08G 73/10* (2006.01)
*C08J 5/18* (2006.01)

(52) U.S. Cl.
CPC ............ *C08G 73/1007* (2013.01); *C08J 5/18* (2013.01)

(58) Field of Classification Search
CPC ............ C08J 2379/08; C08G 73/1042; C08G 73/1067; C08L 79/08
See application file for complete search history.

(56) References Cited

U.S. PATENT DOCUMENTS

| 2008/0090927 A1* | 4/2008 | Ishii | .................... C08G 73/1039 522/47 |
| 2015/0183932 A1 | 7/2015 | Katayama et al. | |
| 2016/0137789 A1* | 5/2016 | Suenaga | ................. B32B 27/08 428/220 |
| 2019/0241705 A1 | 8/2019 | Uno | |

FOREIGN PATENT DOCUMENTS

| JP | 7-106724 A | 4/1995 |
| JP | 2002-161136 A | 6/2002 |
| JP | 2008-214412 A | 9/2008 |
| JP | 2010-31258 A | 2/2010 |
| JP | 2010-157571 A | 7/2010 |
| JP | 2010-202681 A | 9/2010 |
| JP | 2010-235789 A | 10/2010 |
| JP | 2015-187987 | * 10/2015 |
| JP | 2015-187987 A | 10/2015 |
| TW | 201414610 A | 4/2014 |
| TW | 201534657 A | 9/2015 |
| WO | WO 2018/042999 A1 | 3/2018 |

OTHER PUBLICATIONS

International Search Report dated Jul. 17, 2018 in PCT/JP2018/017545 filed on May 2, 2018.
International Preliminary Report on Patentability dated Nov. 21, 2019 in PCT/JP2018/017545 (submitting English translation only).

* cited by examiner

*Primary Examiner* — Gregory Listvoyb
(74) *Attorney, Agent, or Firm* — Oblon, McClelland, Maier & Neustadt, L.L.P.

(57) ABSTRACT

A polyamic acid that has a fluorine atom content of 25 wt % or less and an amount of a fluorine-containing diamine in the polyamic acid is 70 mol % or more with respect to 100 mol % of a sum of diamine components. The total number of moles of tetracarboxylic acid component in the polyamic acid is 0.960 times or more and less than 1.000 time total number of moles of diamine component. The polyamic acid preferably has the structural unit represented by formula (1) and the structural unit represented by formula (2). The polyamic acid may contain trans-1,4-cyclohexanediamine as the diamine component.

18 Claims, No Drawings

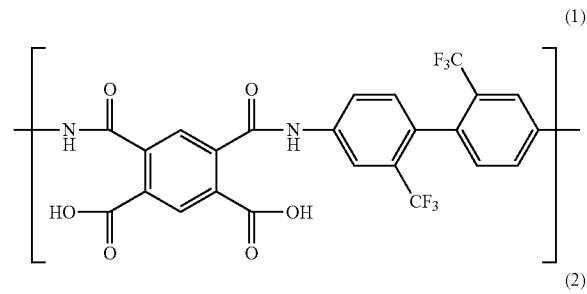

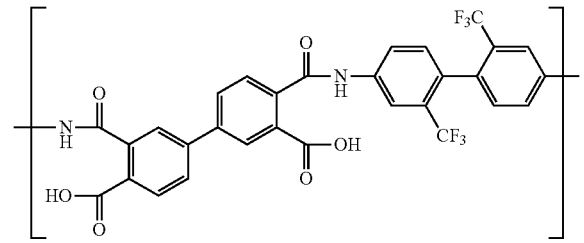

POLY(AMIC ACID), POLY(AMIC ACID) SOLUTION, POLYIMIDE, POLYIMIDE FILM, LAYERED PRODUCT, FLEXIBLE DEVICE, AND PRODUCTION METHOD FOR POLYIMIDE FILM

TECHNICAL FIELD

The present invention relates to polyamic acid, polyamic acid solution, polyimide, and polyimide film. Further, the present invention relates to laminate and flexible device that include the polyimide film.

BACKGROUND ART

In an electronic device such as a display, a solar cell, a touch panel or the like, thickness reduction, weight reduction, and flexibility of the device are demanded, and utilization of a plastic film substrate instead of a glass substrate has been studied. Particularly, in applications required to exhibit high heat resistance, dimensional stability, and high mechanical strength, it is investigated to apply polyimide films as alternative materials for glass.

Polyimides are generally obtained by cyclodehydration of polyamic acids. Polyamic acids are obtained by equimolar reaction of diamines with tetracarboxylic dianhydrides in organic solvents. General wholly aromatic polyimides are colored yellow or brown, but coloring thereof can be suppressed by introduction of an alicyclic structure, a bent structure, a fluorine substituent or the like.

For example, in Patent Document 1, it is described that a polyimide film exhibiting high transparency and a small coefficient of thermal expansion can be fabricated by applying a polyamic acid solution obtained by a reaction of an aromatic tetracarboxylic dianhydride with an alicyclic diamine on a support and heating the polyamic acid solution for imidization. In Patent Document 2, an example is presented in which white polyimide for LED substrate is fabricated by applying a polyamic acid solution obtained by reaction of an aromatic tetracarboxylic dianhydride with a fluorine-containing diamine on a support and heating the polyamic acid solution for imidization.

In the manufacturing process of electronic devices, electronic elements such as a thin film transistor and a transparent electrode are formed on a substrate. High temperature processes are required to form electronic elements, and thus plastic film substrates are required to exhibit heat resistance and dimensional stability so as to be adapted to the high temperature processes. Moreover, in optical devices such as a display, light emitted from the element proceeds through the film substrate, and thus the substrate material is required to exhibit transparency and low haze (turbidity) in addition to high light transmittance in the visible light region.

Electronic device manufacturing processes can be divided into batch type processes and roll-to-roll type processes. In the batch processes, a resin solution is applied on a support and dried to form a film substrate, and an element is formed thereon. Therefore, facilities currently used for glass substrate can be utilized. When the film substrate is polyimide, a laminate in which a support and a polyimide film are adhesively laminated can be formed by applying a polyamic acid solution on the support and heating the polyamic acid together with the support for imidization, and this laminate can also be applied to a batch type process.

PRIOR ART DOCUMENTS

Patent Documents

Patent Document 1: JP 2002-161136 A
Patent Document 2: JP 2010-31258 A

SUMMARY OF THE INVENTION

Problems to be Solved by the Invention

In batch type processes, an element is formed in a state in which a film substrate is formed on a support such as glass. Thus, even in a case where the coefficient of thermal expansion of the film is great, the film substrate does not undergo dimensional changes in the state of a laminate in which the film substrate is fixed on a highly rigid support such as glass. However, when the support and the film disposed thereon has different coefficients of thermal expansion, there is a possibility that warpage due to the residual stress generated at the interface between the support and the film occurs when performing heating and cooling at the time of forming the film on the support. When the warpage occurs, it may be difficult to apply the laminate to the element formation process or the performance of the element may be deteriorated.

In addition, in batch type processes, the preparation of a resin solution is often performed at a distant place from that for the formation of a resin film on a support and the formation of an element thereon. A polyamic acid solution is likely to undergo salt formation and depolymerization when being stored for a long period of time, and haze of a polyimide film may increase when a polyamic acid solution is applied on a support followed by imidization to obtain the polyimide film. For this reason, the polyamic acid solution is required to exhibit solution stability during the period from preparation of the resin solution to application of the resin solution on the support. In addition, as described in Patent Document 2 as well, the polyimide film may have large haze depending on the difference in the environment and conditions for film formation.

Based on such a background, an object of the present invention is to provide a polyamic acid and a polyimide having a low thermal expansion property and small residual stress when being used in formation of a film on a support such as glass, and being less likely to haze and exhibiting excellent transparency even in the case of being applied to a batch type process.

Means for Solving the Problems

The present invention relates to a polyamic acid which is a polyaddition product of diamine and tetracarboxylic dianhydride. In the polyamic acid of the present invention, an amount of a fluorine-containing diamine is 70 mol % or more with respect to 100 mol % of a sum of diamine components. The polyamic acid preferably has a fluorine atom content of 25 wt % or less.

The polyamic acid contains a fluorine-containing diamine such as 2,2'-bis(trifluoromethyl)benzidine as a diamine component and pyromellitic anhydride and 3,3,4,4-biphenyltetracarboxylic dianhydride as a tetracarboxylic dianhydride. The polyamic acid preferably has a structural unit represented by the following Formula (1) and a structural unit represented by the following Formula (2).

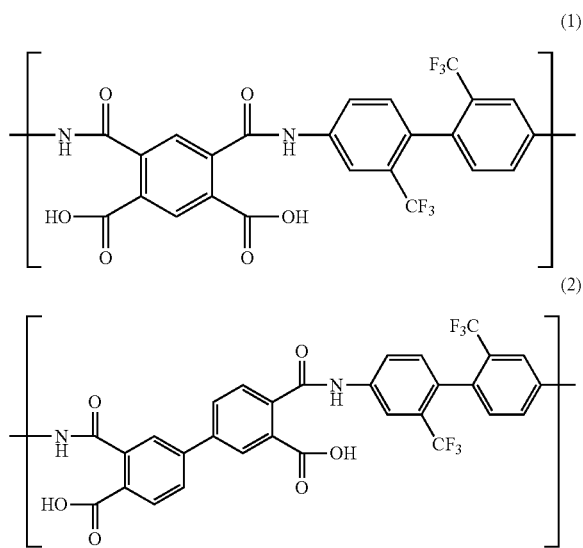

The polyamic acid preferably has the structural unit represented by Formula (1) above and the structural unit represented by Formula (2) above at 70 mol % or more in total.

The polyamic acid may contain a fluorine-free diamine as a diamine component. Examples of the fluorine-free diamine include alicyclic diamines such as trans-1,4-cyclohexanediamine. In one aspect, the polyamic acid contains 1 to 30 mol % of trans-1,4-cyclohexanediamine as a diamine component.

In the polyamic acid of the present invention, a total number of moles of tetracarboxylic acid components is smaller than a total number of moles of diamine components. In other words, in the polyamic acid of the present invention, a proportion of a polyamic acid having an amino group at a terminal is great. The total number of moles of tetracarboxylic acid components in the polyamic acid is preferably 0.960 time or more and less than 1.000 time the total number of moles of diamine components.

A polyamic acid solution contains the polyamic acid and an organic solvent. A polyimide is obtained by cyclodehydration of the polyamic acid. A polyimide film contains the polyimide.

In an embodiment, a polyamic acid solution is applied to a support to form a laminate in which a film-shaped polyamic acid is disposed on the support, and the laminate is heated to imidize the polyamic acid. After imidization, the polyimide film is peeled off from the support.

A flexible device is obtained by forming an electronic element on a polyimide film. An electronic element may be formed on a polyimide film of a laminate in which the polyimide film is disposed on a support, and the polyimide film may be peeled off from the support after formation of the electronic element.

A haze of the polyimide film is preferably 1% or less. A coefficient of thermal expansion of the polyimide film is preferably 15 ppm/K or less. The coefficient of thermal expansion is a coefficient of thermal expansion at the time of temperature rise and a coefficient of thermal expansion at the time of temperature drop at 100° C. to 300° C., and these coefficient of thermal expansions are both preferably 15 ppm/K or less. A yellow index of the polyimide film is preferably 10 or less.

Effects of the Invention

According to the present invention, it is possible to obtain a polyimide film which exhibits low thermal expansion property and excellent transparency, has particularly low haze, and further has low residual stress with a support formed of an inorganic material such as glass.

DESCRIPTION OF EMBODIMENT

[Polyamic Acid]

A polyamic acid is obtained by a polyaddition reaction of a tetracarboxylic dianhydride with a diamine. In the present invention, the polyamic acid contains a fluorine-containing diamine as a diamine component and a fluorine-free aromatic tetracarboxylic dianhydride as a tetracarboxylic dianhydride component.

(Diamine)

The fluorine-containing diamine is preferably a fluorine-containing aromatic diamine from the viewpoint of transparency, reactivity and the like, and among these, a fluoroalkyl-substituted benzidine is preferable. The fluoroalkyl-substituted benzidine has a fluoroalkyl group on either or both benzene rings of 4,4'-diaminobiphenyl. As the fluoroalkyl group in the fluoroalkyl-substituted benzidine, a trifluoromethyl group is preferable. Specific examples of the trifluoromethyl-substituted benzidine include those having one or more trifluoromethyl groups in each of two benzene rings such as 2,2'-bis(trifluoromethyl)benzidine, 3,3'-bis(trifluoromethyl)benzidine, 2,3'-bis(trifluoromethyl)benzidine, 2,2',3-tris(trifluoromethyl)benzidine, 2,3,3'-tris(trifluoromethyl)benzidine, 2,2',5-tris(trifluoromethyl)benzidine, 2,2',6-tris(trifluoromethyl)benzidine, 2,3',5-tris(trifluoromethyl)benzidine, 2,3',6-tris(trifluoromethyl)benzidine, 2,2',3,3'-tetrakis(trifluoromethyl)benzidine, 2,2',5,5'-tetrakis(trifluoromethyl)benzidine, and 2,2',6,6'-tetrakis(trifluoromethyl)benzidine. Among these, 2,2'-bis(trifluoromethyl)benzidine or 3,3'-bis(trifluoromethyl)benzidine is preferable, and 2,2'-bis(trifluoromethyl)benzidine (hereinafter referred to as TFMB) is particularly preferable.

The amount of the fluorine-containing diamine with respect to 100 mol % of the sum of diamine components is preferably 50 mol % or more, more preferably 70 mol % or more, further preferably 80% or more, and particularly preferably 90 mol % or more. Among these, the amount of 2,2'-bis(trifluoromethyl)benzidine is preferably in the above range.

As the diamine components, a diamine fluorine-free diamine may be contained in addition to the fluorine-containing diamine. Examples of the fluorine-free diamine include trans-1,4-cyclohexanediamine, 1,4-phenylenediamine, 1,3-phenylenediamine, 4,4'-oxydianiline, 3,4'-oxydianiline, 4,4'-diaminobenzanilide, 4'-aminophenyl-4-aminobenzene, N,N'-bis(4-aminophenyl)terephthalamide, 4,4'-diaminodiphenylsulfone, o-toridine, 4,4'-bis(aminophenoxy)biphenyl, 2-(4-aminophenyl)-6-aminobenzoxazole, 3,5-diaminobenzoic acid, 4,4'-diamino-3,3'dihydroxybiphenyl, 4,4'-methylenebis(cyclohexaneamine), 1,3-bis(3-aminopropyl)tetramethyldisiloxane, and analogs thereof.

In the case of using a fluorine-free diamine as a diamine component, it is preferable to use an alicyclic diamine from the viewpoint of low thermal expansion property and transparency, and among these, trans-1,4-cyclohexanediamine (hereinafter referred to as CHDA, in some cases) is preferable. When the polyamic acid contains an alicyclic diamine such as CHDA in addition to a fluorine-containing diamine such as TFMB as a diamine component, a polyimide film having low haze and high transparency is likely to be obtained even in the case of performing film formation in an oxygen-containing atmosphere, e.g., in the air.

From the viewpoint of obtaining a polyimide film having low haze without depending on the environment for film formation, the amount of the alicyclic diamine with respect to 100 mol % of the sum of diamine components in the polyamic acid is preferably 1 mol % or more, more preferably 3 mol % or more, and further preferably 5 mol % or more. On the other hand, from the viewpoint of maintaining low thermal expansion property and suppressing the occurrence of turbidity due to salt formation at the time of polymerization etc., the amount of the alicyclic diamine is preferably 30 mol % or less, more preferably 25 mol % or less, further preferably 20 mol % or less, and particularly preferably 15 mol % or less with respect to 100 mol % of the sum of diamine components. In the case of using pyromellitic anhydride and 3,3,4,4-biphenyltetracarboxylic dianhydride as a tetracarboxylic dianhydride, the amount of the alicyclic diamine is preferably in the above range since the haze of the polyimide film tends to increase when the amount of the alicyclic diamine exceeds 30 mol %. In particular, the amount of CHDA among the diamine components is preferably in the above range.

(Tetracarboxylic Dianhydride)

The polyamic acid contains pyromellitic anhydride (hereinafter referred to as PMDA, in some cases) and 3,3,4,4-biphenyltetracarboxylic dianhydride (hereinafter referred to as BPDA, in some cases) as a tetracarboxylic dianhydride component. A polyimide containing PMDA as an acid dianhydride component exhibits low thermal expansion property since the PMDA residue has a rigid structure. BPDA contributes to the improvement in transparency.

The total amount of PMDA and BPDA with respect to 100 mol % of the sum of tetracarboxylic dianhydrides is preferably 50 mol % or more, more preferably 70 mol % or more, further preferably 80% or more, particularly preferably 90 mol % or more, and most preferably 100 mol %. From the viewpoint of achieving both transparency and low thermal expansion property and further diminishing the residual stress of the polyimide film, the proportion of PMDA with respect to 100 mol % of the sum of PMDA and BPDA is preferably 10 to 90 mol % and more preferably 20 to 80 mol %.

As a tetracarboxylic dianhydride component, other tetracarboxylic dianhydrides may be contained in addition to PMDA and BPDA. Examples of other tetracarboxylic dianhydrides include 1,4-phenylenebis(trimellitic dianhydride), 2,3,6,7-naphthalenetetracarboxylic dianhydride, 1,2,5,6-naphthalene tetracarboxylic dianhydride, 2,2',3,3'-biphenyltetracarboxylic dianhydride, 3,3',4,4'-benzophenonetetracarboxylic dianhydride, 4,4'-oxyphthalic dianhydride, 9,9-bis(3,4-dicarboxyphenyl)fluorenic dianhydride, 4,4'-(Hexafluoroisopropylidene)diphthalic anhydride, dicyclohexyl-3,3',4,4'-tetracarboxylic dianhydride, 1,2,4,5-cyclohexanetetracarboxylic dianhydride, cyclobutanetetracarboxylic dianhydride, 2'-oxodispiro[2.2.1]heptane-2,1"-cycloheptane-3,2"-bicyclo[2.2.1]heptane-5,5'-6,6'-tetracarboxylic dianhydride, and analogs thereof.

[Composition of Polyamic Acid]

As described above, the polyamic acid preferably contains TFMB as a diamine component and contains PMDA and BPDA as a tetracarboxylic dianhydride component. In other words, the polyamic acid preferably has a structural unit represented by the following Formula (1) and a structural unit represented by the following Formula (2).

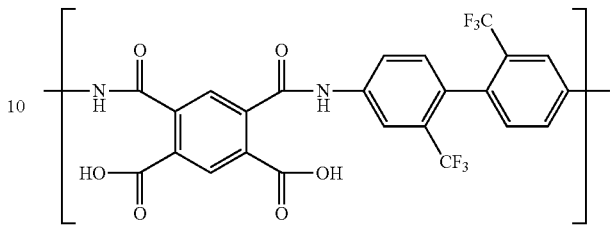

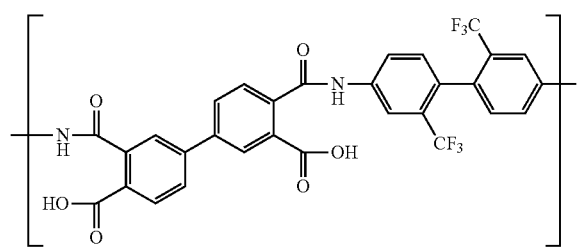

From the viewpoint of developing low thermal expansion property of polyimide and diminishing the residual stress between the polyimide and the support, the total proportion of structural units represented by Formula (1) and Formula (2) contained in the polyamic acid is preferably 50 mol % or more, more preferably 70 mol % or more, further preferably 80 mol % or more, and particularly preferably 90 mol % or more based on 100 mol % of the entire polyamic acid. The proportion of the structural unit represented by Formula (1) to 100 mol % of the sum of structural units represented by Formula (1) and Formula (2) is preferably 10 to 90 mol % and more preferably 20 to 80 mol %. By setting the content of the structural units represented by Formula (1) and Formula (2) to be in the above range, low thermal expansion property and low residual stress can be realized while maintaining high transparency.

As described above, a fluorine-containing diamine is used as a diamine component from the viewpoint of developing transparency. The fluorine content in the polyamic acid is preferably 5 wt % or more, more preferably 10 wt % or more, further preferably 15 wt % or more, and particularly preferably 17 wt % or more from the viewpoint of obtaining a highly transparent polyimide. On the other hand, the fluorine content in the polyamic acid is preferably 25 wt % or less, more preferably 22 wt % or less, and further preferably 21 wt % or less from the viewpoint of obtaining a polyimide film having a low coefficient of thermal expansion and low residual stress. The fluorine content (%) is the proportion of the mass of fluorine atoms in the entire mass of the polyamic acid. A polyamic acid is a polyaddition product of a diamine and a tetracarboxylic dianhydride, and the total mass of diamine and tetracarboxylic dianhydride before polymerization is equal to the mass of polyamic acid after polymerization. Hence, the fluorine content in the polyamic acid can be calculated based on the following equation.

$$100 \times \frac{19.00\left(\sum_i n_i F_i + \sum_j n_j F_j\right)}{\sum_i n_i M_i + \sum_j n_j M_j}$$

In the above equation, $n_i$ denotes the amount (mol) of diamine component i, and $n_j$ denotes the amount (mol) of tetracarboxylic dianhydride j. $M_i$ denotes the molecular weight of diamine component i, and $M_j$ denotes the molecular weight of tetracarboxylic dianhydride j. $F_i$ denotes the number of fluorine atoms contained in one molecule of diamine component i and $F_j$ denotes the number of fluorine atoms contained in one molecule of diamine component j. Incidentally, 19.00 denotes the atomic weight of fluorine.

For example, the fluorine content in a polyamic acid (polyamic acid having a structural unit represented by Formula (1) and a structural unit represented by Formula (2) at a ratio of 8:2) polymerized using 1 mol of TFMB (molecular weight: 320.23, and number of fluorine atoms: 6) as a diamine and 0.8 mol of PMDA (molecular weight: 218.12, and fluorine atom number: 0) and 0.2 mol of BPDA (molecular weight 294.22, and fluorine atom number: 0) as a tetracarboxylic dianhydride is $100 \times 19.00$ $(1 \times 6)/(1 \times 320.23 + 0.8 \times 218.12 + 0.2 \times 294.22) = 20.6\%$.

In the polyamic acid of the present invention, the total number of moles of diamine components is greater than the total number of moles of tetracarboxylic dianhydride components. As the amount of diamine is relatively great, the proportion of a polyamic acid having an amino group at the terminal increases. The ratio (tetracarboxylic dianhydride/diamine) of the total number of moles of the tetracarboxylic dianhydride components to the total number of moles of the diamine components is less than 1.000, preferably 0.999 or less, and more preferably 0.998 or less. As the ratio of tetracarboxylic dianhydride/diamine is smaller, the stability of the polyamic acid is enhanced and a decrease in molecular weight at the time of thermal imidization is suppressed, and there is thus a tendency that the haze of a polyimide film fabricated from a polyamic acid solution can be diminished (e.g., 1% or less).

On the other hand, when the ratio of diamine to tetracarboxylic dianhydride greatly deviates from the equimolar ratio, the molecular weight of the polyamic acid tends to be small so that it may be difficult to form a polyimide film or the mechanical strength of the film may be insufficient. For this reason, the ratio of the total number of moles of the tetracarboxylic dianhydride components to the total number of moles of the diamine components is 0.960 or more, preferably 0.970 or more, and more preferably 0.980 or more.

As a presumptive factor for that the haze of the polyimide film can be diminished by setting the polyamic acid to have a diamine-rich composition, it is mentioned that the generation of low molecular weight components due to depolymerization at the time of thermal imidization is suppressed as the terminal of the polyamic acid is an amino group. When the polyamic acid is depolymerized at the time of thermal imidization, the haze may increase as monomers and low molecular weight components generated by the depolymerization are mixed in the matrix of polyimide. In contrast, when the terminal of the polyamic acid having the structure (1) and structure (2) is an amino group, it is considered that depolymerization due to heating and the like at the time of imidization is suppressed and the haze of the polyimide film is diminished.

The weight average molecular weight of the polyamic acid is preferably from 10,000 to 200,000, more preferably from 30,000 to 180,000, and further preferably from 40,000 to 150,000 although it also depends on the application. When the weight average molecular weight is 10,000 or more, it is possible to form a polyamic acid and a polyimide into a coating film or a film. When the weight average molecular weight is 200,000 or less, a coating film or a film which exhibits sufficient solubility in a solvent and has a smooth surface and a uniform thickness is obtained. The molecular weight is a value in terms of polyethylene oxide by gel permeation chromatography (GPC).

(Synthesis of Polyamic Acid)

A polyamic acid is obtained by reacting a diamine with a tetracarboxylic dianhydride in an organic solvent. For example, a diamine is dissolved or dispersed in an organic solvent in a slurry form to obtain a diamine solution and a tetracarboxylic dianhydride is added to the diamine solution in a solution state of being dissolved or dispersed in an organic solvent in a slurry form or in a solid state. A diamine may be added to a tetracarboxylic dianhydride solution. It is preferable that dissolution and reaction of a diamine and a tetracarboxylic dianhydride is performed in an atmosphere of an inert gas such as argon or nitrogen.

The organic solvent to be used in the synthesis reaction of polyamic acid is not particularly limited. The organic solvent is preferably one that can dissolve the tetracarboxylic dianhydride and diamine to be used and can dissolve the polyamic acid to be generated by polymerization. Specific examples of the organic solvent to be used in the synthesis reaction of polyamic acid include urea-based solvents such as tetramethylurea and N, N-dimethylethylurea; sulfoxide-based or sulfone-based solvents such as dimethyl sulfoxide, diphenyl sulfone, and tetramethylsulfone; ester-based solvents such as N,N-dimethylacetamide (DMAC), N,N-dimethylformamide (DMF), N,N'-diethylacetamide, N-methyl-2-pyrrolidone (NMP), γ-butyrolactone; amide-based solvents such as hexamethylphosphoric triamide; alkyl halide-based solvents such as chloroform and methylene chloride; aromatic hydrocarbon-based solvents such as benzene and toluene; phenol-based solvents such as phenol and cresol: ketone-based solvents such as cyclopentanone; and ether-based solvents such as tetrahydrofuran, 1,3-dioxolane, 1,4-dioxane, dimethyl ether, diethyl ether, and p-cresol methyl ether. Usually, these solvents are used singly but two or more kinds may be appropriately combined if necessary. In order to enhance the solubility and reactivity of the polyamic acid, the organic solvent to be used in the synthesis reaction of polyamic acid is preferably selected from amide-based solvents, ketone-based solvents, ester-based solvents, and ether-based solvents, and amide-based solvents such as DMF, DMAC, and NMP are particularly preferable.

By using plural kinds as either or both of the diamine and the tetracarboxylic dianhydride and adjusting the amount thereof charged, a polyamic acid copolymer having plural kinds of structural units is obtained. For example, a polyamic acid having the structural unit represented by Formula (1) and the structural unit represented by Formula (2) is obtained by using TFMB as a diamine and PMDA and BPDA as a tetracarboxylic dianhydride, and the ratios of the structural unit represented by Formula (1) and the structural unit represented by Formula (2) in the polyamic acid can be adjusted by changing the ratio of PMDA and BPDA.

As described above, in the polyamic acid of the present invention, the total number of moles of diamine components is greater than the total number of moles of tetracarboxylic dianhydride components. In order to obtain a polyamic acid having a diamine-rich composition, the amount (number of moles) of the tetracarboxylic dianhydrides is set to be less than the amount of the diamines. The molar ratio (tetracarboxylic dianhydride/diamine) of the amount of the tetracarboxylic dianhydride components to the amount of diamines is preferably 0.960 or more and less than 1.000, more preferably 0.970 to 0.999, and further preferably 0.980 to 0.998.

The reaction between a diamine and a tetracarboxylic dianhydride is performed, for example, in a temperature range of room temperature to 150° C. The reaction time is about 10 minutes to 30 hours. As the reaction proceeds, the molecular weight of the polyamic acid increases and the viscosity of the reaction mixture increases.

Fluorine-containing diamines such as TFMB have a lower reaction rate with tetracarboxylic dianhydrides such as BPDA and PMDA than fluorine-free aromatic diamines. For this reason, it is preferable to increase the reaction rate by increasing the concentrations of tetracarboxylic dianhydride and diamine in the reaction solution. The concentration of raw materials (diamine and tetracarboxylic dianhydride) charged in the reaction solution is preferably 20 wt % or more. On the other hand, when the concentration of raw materials charged is excessively high, gelation or the like may occur by an increase in the solution viscosity accompanying the progress of the polymerization. Therefore, the charged concentration is preferably 30 wt % or less. The charged concentration is more preferably 22.5 to 25 wt %. Furthermore, the reaction rate can also be further increased by controlling the polymerization temperature. On the other hand, the depolymerization rate also increases when the reaction temperature is excessively high, and there is thus a case where the molecular weight of the polyamic acid does not sufficiently increase. For this reason, the reaction temperature is preferably 30° C. to 70° C. and more preferably 40° C. to 60° C.

[Polyamic Acid Solution]

A polyamic acid solution contains a polyamic acid and a solvent. A solution obtained by reacting a diamine with a tetracarboxylic dianhydride can be used as a polyamic acid solution as it is. In addition, the concentration of the polyamic acid and the viscosity of the solution may be adjusted by removing a part of the solvent from the polymerization solution or adding a solvent. The solvent to be added may be different from the solvent used in the polymerization of the polyamic acid. In addition, a polyamic acid solution may be prepared by dissolving a solid polyamic acid resin obtained by removing the solvent from the polymerization solution in a solvent. As the organic solvent for the polyamic acid solution, amide-based solvents, ketone-based solvents, ester-based solvents, and ether-based solvents are preferable, and among these, amide-based solvents such as DMF, DMAC, and NMP are preferable.

For the purpose of imparting processing characteristics and various functions, and the like, an organic or inorganic low-molecular or high-molecular compound may be added to the polyamic acid solution. Examples of the additive include dyes, pigments, surfactants, leveling agents, plasticizers, silicones, sensitizers, fillers, and fine particles. The polyamic acid solution may contain a photocurable component, a thermosetting component, and a resin component such as a non-polymerizable resin in addition to the polyamic acid.

For the purpose of promoting the imidization reaction, and the like, an imidizing agent and/or a dehydrating agent may be added to the polyamic acid. The imidizing agent is not particularly limited, but it is preferable to use tertiary amines, and among these, a heterocyclic tertiary amine is preferable. Examples of the heterocyclic tertiary amine include pyridine, picoline, quinoline, isoquinoline, and imidazoles. Examples of the dehydration catalyst include anhydrous acetic acid, propionic anhydride, n-butyric anhydride, benzoic anhydride, trifluoroacetic anhydride, and γ-valerolactone.

Imidazoles may be added to the polyamic acid solution. By adding imidazoles to the polyamic acid solution, depolymerization at the time of imidization by heating is suppressed and an increase in haze and a decrease in film strength of the polyimide film tend to be suppressed as well as the stability of the solution is improved. In particular, in the case of performing imidization by heating in an oxygen-containing atmosphere, e.g., in the air, an increase in haze tends to be suppressed by adding imidazoles to the polyamic acid solution in advance.

Imidazoles are compounds containing a 1,3-diazole ring structure such as 1H-imidazole, 2-methylimidazole, 2-undecylimidazole, 2-heptadecylimidazole, 1,2-dimethylimidazole, 2-ethyl-4-methylimidazole, 2-phenylimidazole, 2-phenyl-4-methylimidazole, 1-benzyl-2-methylimidazole, and 1-benzyl-2-phenylimidazole. Among these, 1,2-dimethylimidazole, 1-benzyl-2-methylimidazole, and 1-benzyl-2-phenylimidazole are preferable and 1,2-dimethylimidazole and 1-benzyl-2-methylimidazole are particularly preferable.

The amount of imidazoles added is preferably about 0.005 to 0.1 mol, more preferably 0.01 to 0.08 mol, and further preferably 0.015 to 0.050 mol with respect to 1 mol of the amide groups in the polyamic acid. An "amide group in a polyamic acid" means an amide group formed by a polyaddition reaction of diamine with a tetracarboxylic dianhydride. When the amount of imidazoles added is in the above range, the storage stability of the polyamic acid solution can be maintained while achieving improvement in the film strength and transparency of the polyimide film.

In the case of adding imidazoles, it is preferable to add imidazoles after polymerization of the polyamic acid. The imidazoles may be added to the polyamic acid solution as they are or as a solution.

A silane coupling agent may be added to the polyamic acid solution for the purpose of developing proper adhesive property to the support, and the like. The kind of silane coupling agent is not particularly limited, but a silane coupling agent containing an amino group is preferable from the viewpoint of reactivity with the polyamic acid.

From the viewpoint of suppressing a decrease in the molecular weight of the polyamic acid, the amount of silane coupling agent added is preferably 0.5 part by weight or less, more preferably 0.1 part by weight or less, and further preferably 0.05 part by weight or less with respect to 100 parts by weight of the polyamic acid. In a case where a silane coupling agent is used for the purpose of improving the adhesive property between the polyimide film and the support, and the amount of silane coupling agent added is preferably 0.01 part by weight or more with respect to 100 parts by weight of the polyamic acid.

It is preferable that the residual stress between the support and the polyimide is 20 MPa or less when the polyamic acid solution is applied on the support and heated to form a polyimide film having a thickness of 10±2 μm. In addition, the haze of the polyimide film is preferably 1% or less and the coefficient of thermal expansion at the time of temperature rise and the coefficient of thermal expansion at the time of temperature drop at 100° C. to 300° C. are both preferably 15 ppm/K or less.

[Polyimide]

A polyimide is obtained by cyclodehydration of a polyamic acid. Cyclodehydration can be performed by an azeotropic method using an azeotropic solvent, a thermal method, or a chemical method. The imidization from a polyamic acid to a polyimide can be performed at an arbitrary proportion of 1% to 100%, and a partially imidized polyamic acid may be synthesized.

In order to obtain a polyimide film, a method in which a polyamic acid solution is applied on a support in a film shape and the polyamic acid is cyclodehydrated by heating is preferable. In order to shorten the heating time and develop the properties, an imidizing agent and/or a dehydration catalyst may be added to the polyamic acid solution as described above.

Examples of the support to be coated with the polyamic acid solution include a glass substrate; a metal substrate such as SUS or a metal belt; and a resin film such as polyethylene terephthalate, polycarbonate, polyacrylate, polyethylene naphthalate, or triacetyl cellulose. In order to adapt the polyimide film to a batch type device manufacturing process, it is preferable to use a glass substrate as the support.

In the formation of a polyimide film on a support, a polyamic acid solution is first cast on the support to form a coating film and the laminate of the support and the coating film of polyamic acid is heated at a temperature of 40° C. to 200° C. for 3 to 120 minutes to remove the solvent. Drying may be performed at two or more stages of temperature, for example, at 50° C. for 30 minutes and then at 100° C. for 30 minutes.

As the laminate of the support and the polyamic acid is heated at a temperature of 200° C. to 400° C. for 3 to 300 minutes, the polyamic acid is cyclodehydrated, and a laminate in which a polyimide film is disposed on a support is obtained. At this time, it is preferable to gradually raise the temperature from a low temperature to a high temperature and then from the high temperature to the highest temperature. The rate of temperature rise is preferably 2° C. to 10° C./min and more preferably 4° C. to 10° C./min. The highest temperature is preferably 250° C. to 400° C. Imidization sufficiently proceeds when the highest temperature is 250° C. or more, and thermal deterioration and coloring of polyimide can be suppressed when the highest temperature is 400° C. or less. In heating for imidization, the laminate may be maintained at an arbitrary temperature for an arbitrary time until the temperature reaches the highest temperature.

The heating atmosphere may be any of air, reduced pressure, or an inert gas such as nitrogen. In order to develop high transparency, it is generally preferable to perform heating under reduced pressure or in an oxygen-free or low-oxygen concentration atmosphere, e.g., in an inert gas, and thus to suppress a decrease in the molecular weight. As described above, in the present invention, the polyamic acid has a diamine-rich composition, and thus a polyimide film having low haze and high transparency is obtained even in the case of performing heating in an oxygen-containing atmosphere, for example, in the air. Examples of the heating apparatus include a hot air oven, an infrared oven, a vacuum oven, an inert oven, and a hot plate.

[Application of Polyimide]

The polyimide of the present invention may be subjected to a coating or molding process for fabricating a product or a member as it is. As described above, the polyimide of the present invention can be formed into a polyimide film molded in a film shape. Various inorganic thin films such as metal oxides and transparent electrodes may be formed on the surface of the polyimide film. The methods for forming these inorganic thin films are not particularly limited, and examples thereof include a CVD method, a sputtering method, a vacuum deposition method, and a PVD method such as an ion plating method.

The polyimide of the present invention exhibits heat resistance, transparency, and low thermal expansion property, thus can be utilized as an alternative material for glass, and can be applied to printed matters, color filters, flexible displays, optical films, image display devices such as liquid crystal display devices, organic EL, and electronic paper, 3D displays, touch panels, transparent conductive film substrates, solar cells and the like. In these applications, the thickness of the polyimide film is, for example, about 1 to 200 µm and preferably about 5 to 100 µm.

In particular, the polyimide film of the present invention has low haze and excellent transparency and is thus suitably used as a display substrate material for a TFT substrate, a touch panel substrate and the like. In this application, the polyimide film of the present invention can be applied to, for example, a batch type device fabricating process in which a polyamic acid solution is applied on a support and heated for imidization, an electronic element and the like are formed on the polyimide film to form a substrate, and then the polyimide film is peeled off from the support.

In the batch type device fabricating process, application of the polyamic acid solution on the support and imidization by heating are performed and a laminate in which a polyimide film is adhesively laminated on the support is formed by the above method. When residual stress is generated at the interface between the support and the polyimide film formed on the support, the laminate of the support and polyimide is warped. This may cause a failure in the manufacturing process and the performance of the obtained element may be deteriorated. The polyimide film formed from the polyamic acid solution of the present invention is suitable for a batch type device fabricating process since the residual stress thereof with the glass substrate can be diminished in addition to heat resistance, transparency, and low thermal expansion property. The residual stress between the support and the polyimide is preferably −30 to 30 MPa, more preferably −20 to 20 MPa or less, and further preferably −10 to 10 MPa.

In a batch type device fabricating process, it is preferable that the adhesive property between the support and the polyimide is high in order to accurately form or mount an electronic element and the like on the polyimide film. The 90° peel strength of the polyimide film from the support on which the polyimide film is adhesively laminated is preferably 0.05 N/cm or more and more preferably 0.1 N/cm or more. On the other hand, the peel strength is preferably 0.25 N/cm or less from the viewpoint of workability when peeling off the polyimide film from the support after mounting, and the like.

A method for peeling off the polyimide film from the support is not particularly limited. For example, the polyimide film may be peeled off from the support by hand or using a peeling device such as a driving roll, a robot, or the like. The peeling may also be performed by lowering the adhesion between the support and the polyimide film. For example, the polyimide film may be formed on a support provided with a release layer. It is also possible to promote the peeling by forming a silicon oxide film on a substrate having a large number of grooves and infiltrating with an etching solution. The peeling may also be performed by laser irradiation.

When the support and the polyimide are peeled off from each other by laser irradiation, the polyimide film needs to absorb laser. Therefore, a cut-off wavelength (a wavelength at which a transmittance is 0.1% or less) of the polyimide film is required to be longer than a wavelength of the laser used for the peeling. XeCl excimer laser having a 308 nm wavelength is often used in laser peeling, and thus the cut-off wavelength of the polyimide film is preferably 320 nm or more and more preferably 330 nm or more. On the other hand, the polyimide film tends to be colored yellow when the cut-off wavelength is a long wavelength, and thus the cut-off wavelength is preferably 390 nm or less. From the viewpoint of achieving both transparency (low yellow index) and laser peeling processability, the cut-off wavelength of the polyimide film is preferably 320 to 390 nm and more preferably 330 to 380 nm.

[Properties of Polyimide Film]

The transparency of the polyimide film can also be evaluated, for example, by a total light transmittance and a haze according to JIS K7105-1981. The total light transmittance of the polyimide film is preferably 80% or more, and more preferably 85% or more. The haze of the polyimide film is preferably 1.5% or less, more preferably 1.2% or less, and further preferably 1.0% or less. In applications such as displays, the transmittance is required to be high in the entire visible light wavelength region. The yellow index (YI) of the polyimide film is preferably 15 or less and more preferably 10 or less. YI can be measured in conformity with JIS K7373-2006. Such a highly transparent polyimide film can be used as a transparent substrate for glass alternative applications, etc.

The coefficient of thermal expansion of the polyimide film in a range of 100° C. to 300° C. is preferably 15 ppm/K or less, more preferably 10 ppm/K or less, and further preferably 6 ppm/K or less.

It is preferable that the total light transmittance, haze, yellow index, and coefficient of thermal expansion are in the above ranges when the polyimide of the present invention is formed into a polyimide film having a thickness of 10±2 μm. In addition, it is preferable that the total light transmittance, haze, yellow index, and coefficient of thermal expansion are in the above ranges when the polyamic acid solution of the present invention is applied on a support and heated to form a polyimide film having a thickness of 10±2 μm. Furthermore, it is preferable that the residual stress between the support and the polyimide film is in a range of ±20 MPa.

EXAMPLES

[Evaluation Methods]
<Molecular Weight of Polyamic Acid>

The weight average molecular weight (Mw) was obtained under the conditions shown in Table 1.

TABLE 1

| Item | Condition |
|---|---|
| Apparatus | HLC-8320GPC (manufactured by Tosho Corporation) |
| Column | Shodex GPC KD-806M × 2, each having 8 mmφ × 30 cm, total 60 cm |
| Guard column | Shodex GPC KD-G, 4.6 mmφ × 1 cm |
| Column temperature | 40° C. |
| Eluent | 30 mM-LiBr + 30 mM-phosphoric acid/DMF Flow rate: 0.6 mL/min |
| Injection pressure | about 1.3 to1.7 MPa |
| Injection volume | 30 μL (solid content concentration of 0.4 wt %) |
| Standard sample | Polyethylene oxide (used for preparation of calibration curve) |

TABLE 1-continued

| Item | Condition |
|---|---|
| Detector | RI |
| Order of calibration curve | One dimension |

<Cut-Off Wavelength and Yellow Index>

Using an ultraviolet, visible, and near-infrared spectrophotometer (V-650) manufactured by JASCO, the light transmittance of the polyimide film at 200 to 800 nm was measured and the wavelength (cut-off wavelength) at which the transmittance was 0.1% or less was determined. In addition, yellow index (YI) was calculated based on JIS K7373-2006.

<Total Light Transmittance and Haze>

Measurement was performed according to a method described in JIS K7105-1981 using an integrating sphere type haze meter 300A manufactured by Nippon Denshoku Industries Co., Ltd.

<Coefficient of Thermal Expansion (CTE)>

TMA/SS7100 manufactured by Hitachi High-Tech Science Co., Ltd. was used. A load of 29.4 mN was applied to a sample having a width of 3 mm and a length of 10 mm. Temperature was raised from 20° C. to 350° C. at 10° C./minute, and thereafter, was lowered to 10° C. at 40° C./minute. Coefficients of thermal expansion were respectively determined from amounts of strains at 100-300° C. during temperature rising and during temperature lowering.

<Residual Stress>

On alkali-free glass (thickness: 0.7 mm, 100 mm×100 mm, manufactured by Corning Incorporated) of which the amount of warpage was measured in advance, a polyamic acid solution was applied using a spin coater and heated at 80° C. for 30 minutes in the air and at 350° C. for 1 hour in a nitrogen atmosphere to obtain a laminate in which a polyimide layer having a thickness of 10 μm was disposed on a glass substrate. The amount of warpage of this laminate was measured using a thin film stress measuring device (FLX-2320-S) manufactured by KLA Corporation, and the residual stress generated between the glass substrate and the polyimide film at 25° C. was evaluated.

[Polymerization of Polyamic Acid]

Polyamic acid solutions 1 to 15 were obtained by the following Production Examples 1 to 15. The abbreviations of reagents used in the respective Production Examples are as follows.

NMP: 1-methyl-2-pyrrolidone
BPDA: 3,3'-4,4'-biphenyltetracarboxylic dianhydride
PMDA: pyromellitic dianhydride
6FDA: 4,4'-(hexafluoroisopropylidene)diphthalic anhydride
TFMB: 2,2-bis(trifluoromethyl)benzidine
CHDA: trans-1,4-cyclohexanediamine
APS: γ-aminopropyltriethoxysilane
DMI: 1,2-dimethylimidazole Production Example 1

Into a 500 mL glass separable flask equipped with a nitrogen introduction tube and a stirrer having a stainless steel stirring rod, 51.67 g of NMP was charged, 8.685 g (27.12 mmol) of TFMB was added thereto, and the mixture was stirred. To this solution, 1.588 g (5.40 mmol) of BPDA was added, the mixture was stirred for 10 minutes or more, then 4.727 g (21.67 mmol) of PMDA was added thereto, and this mixture was heated at 50° C. for 3 hours. To the resultant mixture, 33.33 g of NMP was added to dilute the solid concentration to 15 wt %, and the mixture was cooled and stirred at room temperature (23° C.) for 1 hour to obtain a polyamic acid solution.

Production Examples 2 to 8 and 12 to 15

Polyamic acid solutions were obtained in the same manner as in Production Example 1 except that the amounts of diamine components and tetracarboxylic dianhydride components were changed as presented in Table 2. In Production Examples 6 to 8, 12, and 13, CHDA was charged together with TFMB, BPDA was added thereto, the mixture was stirred for 10 minutes or more, and then PMDA was added to the mixture. In Production Examples 14 and 15, TFMB was charged and then PMDA and 6FDA were added thereto.

Production Example 9

Into a 2000 mL glass separable flask equipped with a nitrogen introduction tube and a stirrer having a stainless steel stirring rod, 792.22 g of NMP was charged, 119.49 g (373.1 mmol) of TFMB and 4.73 g (41.5 mmol) of CHDA were added thereto, and the mixture was stirred. To this solution, 60.13 g (204.3 mmol) of BPDA was added, the mixture was stirred for 10 minutes or more, then 44.58 g (204.4 mmol) of PMDA was added thereto, and this mixture was heated at 45° C. for 3 hours. Thereafter, 0.61 g (2.8 mml) of BPDA and 0.45 g (2.1 mmol) of PMDA were added and heated at 45° C. for 6 hours. To the resultant mixture, 127.79 g of NMP was added to dilute the solid concentration to 20 wt %, and the mixture was cooled and stirred at room temperature (23° C.) for 1 hour to obtain a polyamic acid solution.

Production Example 10

The polyamic acid solution obtained in Production Example 9 was heated at 60° C. for 5 hours and then at 70° C. for 1.5 hours to decrease the molecular weight by depolymerization of the polyamic acid.

Production Example 11

The polyamic acid solution obtained in Production Example 9 was heated at 80° C. for 6 hours to decrease the molecular weight by depolymerization of the polyamic acid.

Examples 1 to 14 and Comparative Examples 1 to 4: Fabrication of Polyimide Film

The polyamic acid solutions obtained in Production Examples were applied on a glass plate using a spin coater and heated at 80° C. for 30 minutes in the air and at 350° C. for 1 hour in a nitrogen atmosphere to form polyimide films having a thickness of 10 to 15 μm. In Examples 3 to 7, Examples 9 to 11, and Example 13, polyamic acids obtained by adding DMI and APS as additives to the polyamic acids at the ratios presented in Table 2 with respect to 100 parts by weight (100 hr) of the solids in the polyamic acids were used.

The compositions and molecular weights of the polyamic acids in the respective Production Examples, the additives used at the time of fabrication of the polyimide films, and the evaluation results for the polyimide films are presented in Table 2.

TABLE 2

| | Polyamic acid | | | | | | | | Additive |
| --- | --- | --- | --- | --- | --- | --- | --- | --- | --- |
| | Production Example | Dianhydride [mol %] | | | Diamine [mol %] | | F content [%] | Mw [—] | DMI [phr] |
| | | BPDA | PMDA | 6FDA | TFMB | CHDA | | | |
| Example 1 | 1 | 19.9 | 79.9 | — | 100 | — | 20.6 | 148,500 | — |
| Example 2 | 2 | 49.8 | 49.8 | — | 100 | — | 19.8 | 93,000 | — |
| Example 3 | 2 | 49.8 | 49.8 | — | 100 | — | 19.8 | 93,000 | 1 |
| Comparative Example1 | 3 | 51.5 | 51.5 | — | 100 | — | 19.5 | 83,000 | — |
| Comparative Example2 | 4 | 52.1 | 52.1 | — | 100 | — | 19.4 | 55,000 | — |
| Example 4 | 5 | 89.9 | 9.9 | — | 100 | — | 18.8 | 152,000 | 3 |
| Example 5 | 6 | 48.8 | 48.8 | — | 90 | 10 | 18.7 | 102,000 | 1 |
| Example 6 | 7 | 49.3 | 49.3 | — | 90 | 10 | 18.6 | 80,200 | 1 |
| Example 7 | 8 | 49.8 | 49.8 | — | 90 | 10 | 18.5 | 135,000 | 1 |
| Example 8 | 9 | 49.8 | 49.8 | — | 90 | 10 | 18.5 | 108,000 | — |
| Example 9 | 9 | 49.8 | 49.8 | — | 90 | 10 | 18.5 | 108,000 | 1 |
| Example 10 | 10 | 49.8 | 49.8 | — | 90 | 10 | 18.5 | 69,900 | 1 |
| Example 11 | 11 | 49.8 | 49.8 | — | 90 | 10 | 18.5 | 48,500 | 1 |
| Example 12 | 12 | 49.8 | 49.8 | — | 80 | 20 | 17.1 | N.D. | — |
| Example 13 | 12 | 49.8 | 49.8 | — | 80 | 20 | 17.1 | N.D. | 1 |
| Example 14 | 13 | 49.8 | 49.8 | — | 70 | 30 | 15.5 | N.D. | — |
| Comparative Example3 | 14 | — | 50.0 | 50.0 | 100 | — | 26.3 | 76,000 | — |
| Comparative Example4 | 15 | — | 30.0 | 70.0 | 100 | — | 27.8 | 92,000 | — |

| | Additive | Properties of polyimide film | | | | | |
| --- | --- | --- | --- | --- | --- | --- | --- |
| | APS [phr] | Thickness [μm] | Haze [%] | CTE [ppm/K] | Residual stress [MPa] | YI [—] | Cut-off [nm] |
| Example 1 | — | 10 | 0.4 | −5 | 1 | 9 | 373 |
| Example 2 | — | 10 | 0.4 | 2 | 2 | 7 | 373 |
| Example 3 | 0.3 | 10 | 0.5 | 2 | 4 | 8 | 373 |

TABLE 2-continued

| | | | | | | | |
|---|---|---|---|---|---|---|---|
| Comparative Example1 | — | 10 | 89.4 | 7 | 5 | 65 | 373 |
| Comparative Example2 | — | 11 | 33.7 | 3 | 3 | 94 | 390 |
| Example 4 | — | 10 | 0.5 | 10 | 13 | 5 | 375 |
| Example 5 | 0.3 | 10 | 0.4 | 3 | 7 | 7 | 372 |
| Example 6 | 0.3 | 11 | 0.3 | 3 | 2 | 7 | 373 |
| Example 7 | 0.3 | 9 | 0.2 | 3 | 2 | 8 | 371 |
| Example 8 | — | 11 | 0.3 | 3 | 6 | 7 | 372 |
| Example 9 | 0.3 | 12 | 0.3 | 3 | 2 | 7 | 373 |
| Example 10 | 0.3 | 11 | 0.2 | 4 | 5 | 7 | 372 |
| Example 11 | 0.3 | 11 | 0.2 | 6 | 6 | 8 | 374 |
| Example 12 | — | 10 | 0.8 | 10 | N.D. | 8 | 373 |
| Example 13 | — | 11 | 0.4 | 10 | N.D. | 7 | 373 |
| Example 14 | — | 10 | 4.2 | 16 | N.D. | 10 | 372 |
| Comparative Example3 | — | 10 | 0.5 | 61 | 45 | 6 | 337 |
| Comparative Example4 | — | 10 | 0.4 | 77 | 45 | 3 | 323 |

The polyimide films obtained in Examples 1 to 14 all had low haze, excellent transparency, low coefficient of thermal expansion, low residual stress, and excellent dimensional stability. In Comparative Examples 1 and 2 in which tetracarboxylic dianhydrides were used in an excess amount with respect to the amount of diamines, the haze of the polyimide films was remarkably increased.

In Comparative Example 3 and Comparative Example 4 in which PMDA and 6FDA were used as a tetracarboxylic dianhydride, the polyimide film had low haze even when the amount of tetracarboxylic dianhydride was equal to the amount of diamine. However, the polyimide films of Comparative Example 3 and Comparative Example 4 had a great coefficient of thermal expansion (CTE), and the residual stress thereof thus increased.

In Examples 5 to 14 in which CHDA was used in addition to TFMB as a diamine, the haze of the polyimide film was low and excellent transparency was exhibited as in Examples 1 to 3 in which only TFMB was used as a diamine. In addition, although the data is not presented, it has been confirmed that a polyimide film having lower haze is obtained in the case of containing CHDA as a diamine component when imidization is performed by heating at 350° C. for 1 hour in an air atmosphere.

On the other hand, when the amount of CHDA among the diamines was increased, the coefficient of thermal expansion (CTE) tended to increase. In addition, in Example 14 in which the amount of CHDA was 30 mol %, the haze of the polyimide film was higher than in other Examples. From these results, it can be seen that a polyimide film exhibiting excellent transparency and a low coefficient of thermal expansion is obtained without depending on the environment for film formation as an alicyclic diamine such as CHDA as a diamine component is contained in a range of 30 mol % or less in addition to a fluorine-containing diamine such as TFMB.

From the above results, it can be seen that a polyimide film having low haze, excellent transparency, and low residual stress at the interface with a support such as glass is obtained as the polyamic acid solution of the present invention is used. Such a laminate of a polyimide film and a support is suitable for processes such as fabrication of electronic elements by batch processes.

The invention claimed is:

1. A polyamic acid that is a polyaddition product of a diamine and tetracarboxylic dianhydride, wherein
a fluorine atom content of the polyamic acid is 25 wt % or less,
an amount of a fluorine-containing diamine component is 70 mol % or more with respect to 100 mol % of a total amount of a diamine component in the polyamic acid,
the polyamic acid comprises a first structural unit represented by the Formula (1) and a second structural unit represented by the Formula (2),
a total number of moles of a tetracarboxylic dianhydride component is 0.960 times to less than 1.000 time a total number of moles of the diamine component, and
the diamine component comprises 1 to 30 mol % of trans-1,4-cyclohexanediamine:

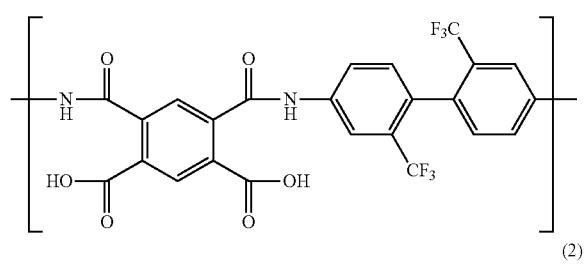

(1)

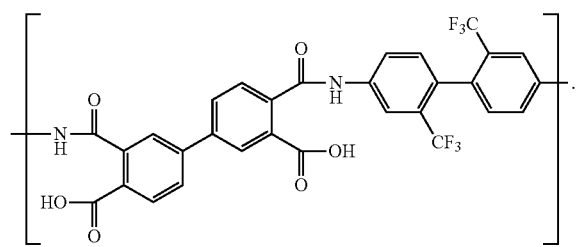

(2)

2. The polyamic acid according to claim 1, wherein a total amount of the first structural unit and the second structural unit is 70 mol % or more.

3. A polyamic acid solution, comprising:
the polyamic acid according to claim 1; and
an organic solvent.

4. A polyimide that is a cyclodehydration product of the polyamic acid according to claim 1.

5. A polyimide film, comprising:
the polyimide according to claim 4.

6. The polyimide film according to claim 5, wherein a haze of the polyimide film is 1% or less, and a coefficient of thermal expansion of the polyimide film when a temperature rises from 100° C. to 300° C. is 15 ppm/K or less.

7. The polyimide film according to claim 5, wherein a yellow index of the polyimide film is 10 or less.

8. A laminate, comprising:
a support; and
the polyimide film according to claim 5 disposed on the support.

9. A flexible device, comprising:
the polyimide film according to claim 5; and
an electronic element disposed on the polyimide film.

10. A method for manufacturing a polyimide film, comprising:
applying the polyamic acid solution according to claim 3 onto a support, thereby forming a laminate comprising a film-shaped polyamic acid on the support; and
heating the laminate to imidize the polyamic acid.

11. The method of claim 10, further comprising:
peeling off the support from the polyimide film formed by the imidization of the polyamic acid.

12. The polyamic acid according to claim 1, wherein an amount of the first structural unit is 10 to 90 mol % with respect to 100 mol % of a total amount of the first structural unit and the second structural unit.

13. The polyamic acid according to claim 1 wherein a total amount of the first structural unit and the second structural unit is 90 mol % or more.

14. The polyamic acid according to claim 1, wherein the fluorine atom content of the polyamic acid is from 5 wt % to 25 wt %.

15. The polyamic acid according to claim 1, wherein the fluorine atom content of the polyamic acid is from 17 wt % to 21 wt %.

16. The polyamic acid according to claim 1, wherein the total number of moles of tetracarboxylic dianhydride component is 0.970 to 0.999 times the total number of moles of the diamine component.

17. The polyamic acid according to claim 1, wherein the total number of moles of tetracarboxylic dianhydride component is 0.980 to 0.998 times the total number of moles of the diamine component.

18. The polyamic acid according to claim 1, having a weight average molecular weight of 10,000 to 200,000.

* * * * *